United States Patent

Sugiyama et al.

[11] Patent Number: 6,160,462
[45] Date of Patent: Dec. 12, 2000

[54] ENERGY TRAPPING TYPE PIEZOELECTRIC FILTER WITH IDENTICAL PIEZOELECTRIC SUBSTRATES

[75] Inventors: Takeshi Sugiyama, Ise; Manabu Wakita, Misono-mura, both of Japan

[73] Assignee: NGK Spark Plug Co., Ltd., Nagoya, Japan

[21] Appl. No.: 09/132,489

[22] Filed: Aug. 11, 1998

[30] Foreign Application Priority Data

Aug. 12, 1997 [JP] Japan ..................................... 9-231741
Dec. 6, 1997 [JP] Japan ..................................... 9-352037

[51] Int. Cl.[7] ........................... H03H 9/205; H03H 9/10; H03H 9/58
[52] U.S. Cl. ......................... 333/189; 310/321; 310/345; 310/348; 310/366
[58] Field of Search .................... 333/186–192; 310/321, 345, 348, 366

[56] References Cited

U.S. PATENT DOCUMENTS

| 4,045,753 | 8/1977 | Arakawa | 333/191 |
| 6,002,308 | 12/1999 | Gamo | 310/366 X |
| 6,011,451 | 1/2000 | Gamo | 310/366 X |

FOREIGN PATENT DOCUMENTS

| 55-112021 | 8/1980 | Japan | 333/186 |
| 62-11314 | 1/1987 | Japan | 333/189 |
| 62-7213 | 1/1987 | Japan | 333/187 R |
| 3-97314 | 4/1991 | Japan | 333/191 |
| 4-4603 | 1/1992 | Japan . | |
| 4-329014 | 11/1992 | Japan | 333/187 |
| 5-67943 | 3/1993 | Japan | 333/190 |
| 5-259805 | 10/1993 | Japan | 333/187 R |
| 6-6175 | 1/1994 | Japan | 333/191 |
| 7-263999 | 10/1995 | Japan . | |
| 10-335976 | 12/1998 | Japan . | |

Primary Examiner—Benny T. Lee
Assistant Examiner—Barbara Summons
Attorney, Agent, or Firm—Larson & Taylor PLC

[57] ABSTRACT

An energy trapping type piezoelectric filter having a minimal surface area comprises a first and second identical piezoelectric substrates 10a and 10b being laid one on the other to form a multilayer structure, each having a first surface provided with a pair of oscillatory electrodes 11 and 12 arranged vis-a-vis relative to each other and a capacitor electrode 14 which is connected to one of the oscillatory electrodes 12, the other oscillatory electrode 11 being electrically connected to an input/output connection terminal 13 also arranged on the first surface, and a second surface provided with a common electrode 16 arranged oppositely relative to said pair of oscillatory electrodes 11 and 12 and a capacitor electrode 17 arranged opposite to said capacitor electrode 14, the capacitor electrode 17 and the common electrode 16 being electrically connected to each other, the pair of oscillatory electrodes 11 and 12 and the common electrode 16 forming an oscillating section V, the capacitor electrodes 14 and 17 forming a coupling capacitor C1 (C2).

The energy trapping type piezoelectric filter further may comprise a shield electrode means 19 and 34 for any electromagnetic coupling of a pair of input/output electrodes and/or terminals.

9 Claims, 14 Drawing Sheets

PRIOR ART

ENERGY TRAPPING TYPE PIEZOELECTRIC FILTER WITH IDENTICAL PIEZOELECTRIC SUBSTRATES

BACKGROUND OF THE INVENTION

1. Field of the Invention

The present invention relates to an energy trapping type piezoelectric filter comprising a substrate having a plurality of oscillating sections.

2. Prior Art

Various energy trapping type piezoelectric filters are known to date. For example, Japanese Patent Kokai No. 7-263999 discloses such a piezoelectric filter.

Referring to FIGS. 1, 2A and 2B of the accompanying drawings, a piezoelectric filter as disclosed in the above patent document comprises a unitary piezoelectric substrate A, which is provided on a surface thereof with two pairs of laterally arranged oscillatory electrodes B and C, of which the inner oscillatory electrodes B are connected to a centrally arranged capacitor electrode D, as shown in FIG. 2A, and on the other surface thereof with a pair of laterally arranged common electrodes E, which are connected to a centrally arranged capacitor electrode F, as shown in of FIG. 2B. The central capacitor electrode F is located oppositely relative to the capacitor electrode D with the piezoelectric substrate A disposed therebetween. Thus, a pair of oscillating sections V are formed by the two pairs of oscillatory electrodes B and C and the common electrodes E while a coupling capacitor G is formed by the capacitor electrodes F and D. In other words, the unitary piezoelectric substrate A carries thereon a pair of lateral oscillating sections V and a central coupling capacitor G. FIG. 3 is an equivalent circuit diagram of the piezoelectric filter.

The above described conventional arrangement, using a pair of lateral oscillating sections V and a central coupling capacitor G carried on a unitary piezoelectric substrate A, however, is accompanied by a problem that the piezoelectric substrate A is inevitably forced to have an oblong profile and the piezoelectric filter has to have a large surface area for carrying the above listed components thereon. Additionally, such a piezoelectric filter is subjected to various restrictions in terms of the profile, the thickness and the regions assigned to the oscillating sections to significantly limit the variable capacitance range, although the piezoelectric filter has only a single coupling capacitor G.

Therefore, it is the object of the present invention to provide an energy trapping type piezoelectric filter that is free from the above identified problem of the conventional piezoelectric filters.

SUMMARY OF THE INVENTION

According to a first aspect of the invention, there is provided an energy trapping type piezoelectric filter comprising:

a first and second identical piezoelectric substrates;

a first electrode pattern provided on a first surface of each of the first and second piezoelectric substrates, the first electrode pattern including a pair of oscillation electrodes arranged vis-a-vis relative to each other and a first capacitor electrode, one of said oscillation electrodes being electrically connected to said first capacitor electrode, the other oscillation electrode being electrically connected to an input/output connection terminal which is provided on the first surface;

a second electrode pattern provided on a second surface of each of the first and second piezoelectric substrates, the second electrode pattern including a common electrode arranged oppositely relative to said pair of oscillation electrodes and a second capacitor electrode arranged opposite to said first capacitor electrode, said second capacitor electrode and said common electrode being electrically connected to each other;

a pair of oscillating sections, each oscillating section including a pair of the first and second oscillation electrodes and said common electrode on each of the first and second piezoelectric substrates;

a pair of coupling capacitors, each coupling capacitor including said first and second capacitor electrodes on each piezoelectric substrate;

spacer members arranged to be disposed on the respective surfaces of said first and second piezoelectric substrates and each having an opening for not obstructing the oscillation of each of the oscillating sections, said first and second piezoelectric substrates are sandwiched by the spacer members to produce a multilayer structure;

a pair of insulating cover plates provided on a top and bottom surfaces of said multilayer structure; and conductor means for electrically connecting the first capacitor electrodes on the respective first surfaces of said first and second piezoelectric substrates relative to each other, the second capacitor electrodes on the respective second surfaces of said first and second piezoelectric substrates relative to each other, the input/output connection terminals respectively to an input electrode and an output electrode arranged at a side of the filter and exposed to the outside and the second electrode pattern on the second surfaces to a grounding electrode arranged at another side of the filter and exposed to the outside.

Thus, the first and second piezoelectric substrates, each having a single oscillating section, are laid one on the other to have the above described configuration so that they have only a limited surface area for carrying the related components of the piezoelectric filter. Additionally, since the first and second piezoelectric substrates carry thereon respective capacitor electrodes that form a pair of coupling capacitors which are connected in parallel to each other, the coupling capacitance of the device can be selected freely to allow an enhanced degree of freedom for the design of the device if compared with the conventional piezoelectric filters of the type under consideration having a single coupling capacitor.

The input/output connection terminals connected to the second oscillation electrode may be displaced from the center of the related lateral edge and the paired capacitor electrodes may be vertically aligned when one of the first and second piezoelectric substrates are turned upside down. Thus, the capacitor electrodes on the first sides and those on the second sides of the piezoelectric substrates are aligned vertically so that they can be connected electrically without difficulty, whereas the input/output connection terminals are displaced from the center of the related lateral edges and appear symmetrically as viewed from above when one of the piezoelectric substrates is turned upside down so that they are not vertically aligned with each other. Thus, as the input/output connection terminal of one of the piezoelectric substrates is connected to the input electrode and the input/output connection terminal of the other piezoelectric substrate is connected to the output electrode, they will never be short-circuited with each other and can be insulated reliably from each other dye to the fact that the input/output connection terminals are located askance relative to each other.

The spacers may be provided with recesses along the edges thereof that are filled with an electrically conductive material to form conduction paths for connecting the input/ output connection terminals respectively to the input electrodes and the output electrodes and the electrode patterns on the second surfaces to the grounding electrode.

With such an arrangement, any related ones of the electrodes and the terminals may be mutually connected by the electrically conductive material filled into the recesses after the first and second piezoelectric substrates are laid into a multilayer structure.

With such an arrangement, the first piezoelectric substrate will be laid on the second piezoelectric substrate or vice versa so that the distance between the input/output connection terminals of the first and second piezoelectric substrates and also the distance between the input electrode and the output electrode disposed on one of the insulating cover plates of a piezoelectric filter according to the invention will be reduced significantly if compared with the conventional devices as illustrated in FIGS. 1, 2A and 2B and apt to easily become electromagnetically coupled with each other to damage the attenuation characteristic of the device. While this problem may be dissolved by separating the input/ output connection terminals from each other and also the input electrode from the output electrode, the piezoelectric substrates will then inevitably show a large surface area to damage the advantages of the invention.

Therefore, another object of the present invention is to provide an energy trapping type piezoelectric filter that is free from the above identified problem of easy electromagnetic coupling.

The above problem may be dissolved by the present invention.

According to a second aspect of the invention, there is provided a energy trapping type piezoelectric filter as described above, wherein each of the second electrode patterns on the second surfaces of the first and second piezoelectric substrates includes a shield electrode extending to be disposed, if viewed from above, between the input/output connection terminal of the first piezoelectric substrate and that of the second piezoelectric substrate that are located askance relative to each other on a same side of the piezoelectric filter.

With the above arrangement, the shield electrodes are located between the input/output connection terminal of the first piezoelectric substrate and that of the second piezoelectric substrate if viewed from above and the shield electrodes are electrically grounded by way of the grounding electrode arranged on one of the insulating cover plates and electrically connected to the electrode patterns on the second surfaces of the first and second piezoelectric substrates so that any tendency of electromagnetically coupling the input/ output connection terminals and also the input electrode and the output electrode that are vertically aligned with the input/output connection terminals is obstructed by the shield electrodes to improve the attenuation characteristic of the device.

Additionally, a shield electrode may be extended from the grounding electrode arranged on one of the insulating cover plates such that it is located between the input electrode and the output electrode.

Then, the shield electrode extending from the grounding electrode is interposed between the input electrode and the output electrode arranged on that insulating cover plate so that any tendency of electromagnetically coupling the input electrode and the output electrode and also the input/output connection terminal of the first piezoelectric substrate and that of the second piezoelectric substrate is obstructed by the shield electrodes to improve the attenuation characteristic of the device.

When both the shield electrodes in the electrode patterns on the second surfaces of the piezoelectric substrates and the shield electrode extending from the grounding electrode are used in combination, the attenuation characteristic of the device will be further improved.

DESCRIPTION OF THE PREFERRED EMBODIMENTS OF THE INVENTION

Now, the present invention will be described by referring to the accompanying drawings that illustrate preferred embodiments of the present invention.

Figure 4:
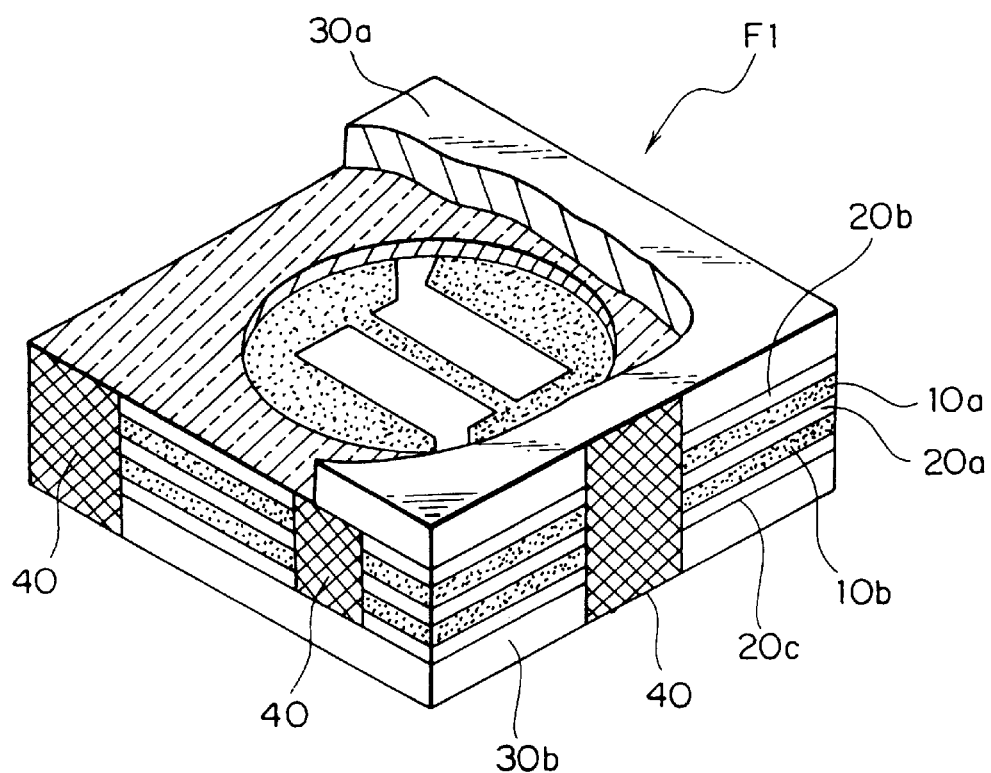
FIG. 4 is a partly cut-away schematic perspective view of a first embodiment of energy trapping type piezoelectric filter F1 according to the present invention.
Figure 5:
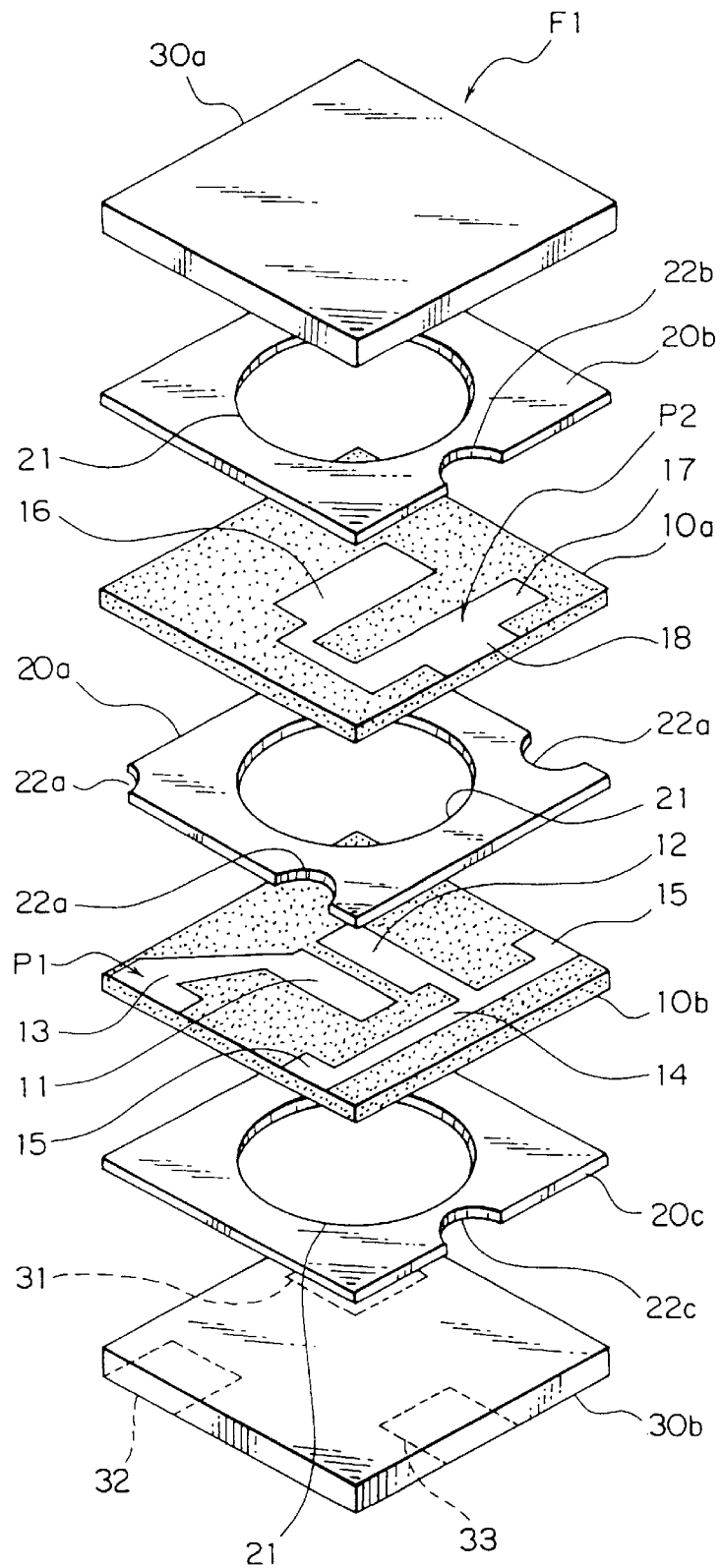
FIG. 5 is an exploded schematic perspective view of the embodiment of piezoelectric filter F1 of FIG. 4.
Figure 6A:
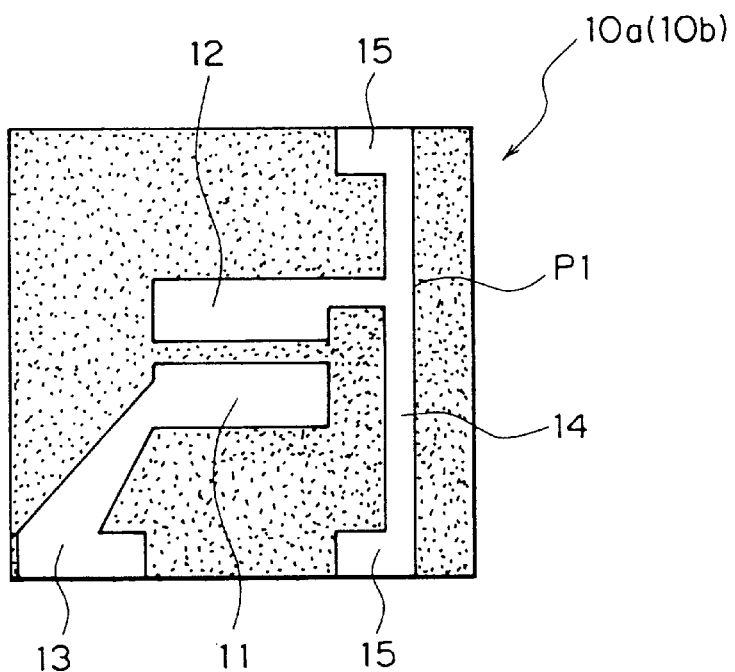
FIG. 6A is a schematic plan view of the upper surface of the piezoelectric substrates in the embodiment of FIG. 4.
Figure 6B:
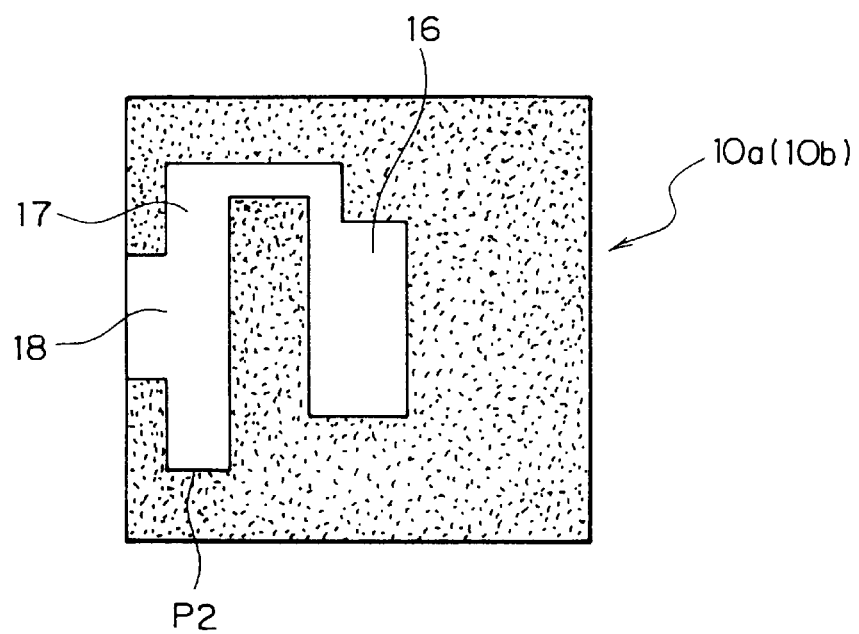
FIG. 6B is a schematic plan view of the lower surface of the piezoelectric substrates in the embodiment of FIG. 4.

FIGS. 4 through 6 show a first embodiment of an energy trapping type piezoelectric filter F1 according to the present invention.

The illustrated piezoelectric filter F1 comprises a first piezoelectric substrate 10a and a second piezoelectric substrate 10b having an identical configuration and arranged in layers with a spacer 20a interposed therebetween and upper and lower insulating cover plates 30a and 30b arranged on and under the respective piezoelectric substrates with spacers 20b and 20c also interposed therebetween.

Now, the piezoelectric substrates 10a, 10b will be described in detail by referring to FIG. 6.

The piezoelectric substrates 10a and 10b are made of a piezoelectric ceramic material such as $PbTiO_3$, $PbZrO_3$ or $PbTiO_3$—$PbZrO_3$ and each of them carries electrode patterns P1 and P2 arranged respectively on the opposite surfaces thereof. The electrode patterns P1 and P2 arranged on the opposite surfaces of each of the piezoelectric substrates 10a, 10b are typically formed by deposition of silver or by screen printing of silver paste.

Firstly, the electrode pattern P1 arranged on the first surface of each of the piezoelectric substrates 10a and 10b will be described. A pair of oscillation electrodes 11 and 12 are arranged on the first surface and separated from each other. The oscillation electrode 11 extends obliquely to a corner of the piezoelectric substrate 10a or 10b to form an input/output connection terminal 13 (along an edge starting from the corner). In other words, the input/output connection terminals 13 on the piezoelectric substrates 10a and 10b are formed at a biased position along a lateral edge thereof so that, when one of the piezoelectric substrates 10a and 10b is longitudinally turned upside down, the input/output connection terminals 13 are located to be displaced relative to each other and hence do not interfere with each other.

On the first surface of each of the piezoelectric substrates 10a and 10b, a narrow strip-shaped capacitor electrode 14 is arranged along the lateral edge opposite to the edge where the input/output connection terminal 13 is formed. The capacitor electrode 14 extends between the longitudinal opposite edges of the piezoelectric substrate to produce connector edges 15 so that the connector edges 15 of the two piezoelectric substrates 10a and 10b are vertically aligned with each other when one of the piezoelectric substrates 10a and 10b is longitudinally turned upside down.

Now, the electrode pattern P2 on the second surface of each of the piezoelectric substrates 10a and 10b will be described.

The electrode pattern P2 comprises a common electrode 16 arranged oppositely relative to said pair of oscillation electrodes 11 and 12 and a capacitor electrode 17 disposed oppositely relative to the capacitor electrode 14 on the first surface and electrically connected to the common electrode 16. The capacitor electrode 17 extends laterally to the corresponding lateral edge to form a grounding connector terminal 18.

Figure 9:
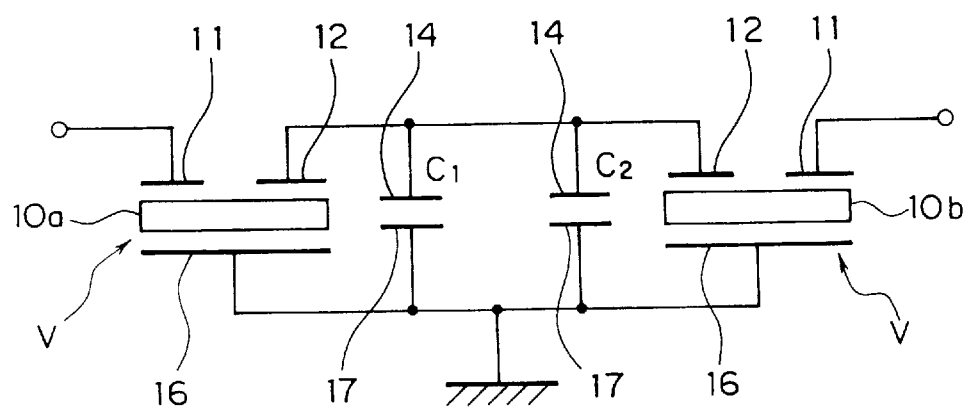
FIG. 9 is a schematic circuit diagram of an equivalent circuit of the embodiment of piezoelectric filter F1 of FIG. 4.

Thus, as will be seen in FIG. 9, the pair of oscillation electrodes 11 and 12 and the common electrode 16 form an oscillating section V, while the capacitor electrodes 14 and 17 of each of the piezoelectric substrates 10a and 10b form respective coupling capacitors C1 and C2.

Then, the first piezoelectric substrate 10a is turned upside down so that the pairs of capacitor electrodes 14 and 17 of the two piezoelectric substrates 10a and 10b are vertically aligned. Thus, the connector terminal 18 and the connector edges 15 of the piezoelectric substrate 10a are also vertically aligned with the respective counterparts of the piezoelectric substrate 10b so that they may be electrically connected with each other without difficulty. With the above described positional arrangement, on the other hand, the input/output connection terminals 13 of the two piezoelectric substrates 10a and lob are located askance relative to each other at the respective corners. Then, the input/output connection terminal 13 of the piezoelectric substrate 10a is electrically connected to an input electrode 31 operating as input terminal as will be described in greater detail hereinafter, whereas the input/output connection terminal 13 of the piezoelectric substrate 10b is electrically connected to an output electrode 32 operating as output terminal as will be described hereinafter so that the two input/output connection terminals 13 will never be short-circuited and reliably insulated from each other.

Then, the piezoelectric substrates 10a and 10b are laid one on the other with a spacer 20a interposed therebetween.

Subsequently, a pair of spacers 20b and 20c are arranged respectively on and under the first and second piezoelectric substrates 10a and 10b. Each of the spacers 20a, 20b, 20c is made of an insulator sheet having a circular opening 21 at the center so as not to obstruct the oscillation of the related oscillating section or oscillating sections.

The insulating cover plate 30a is disposed on the upper surface of the spacer 20b, while another insulating cover plate 30b is disposed under the lower surface of the spacer 20c. Then, an input electrode 31, an output electrode 32 and a grounding electrode 33 are formed on the lower surface of the insulating cover plate 30b. The input electrode 31 and the output electrode 32 are interchangeable as they are symmetrical in terms of equivalent circuit as shown in FIG. 9.

The connector edges 15 of the capacitor electrodes 14 on the first and second piezoelectric substrates 10a and 10b arranged at a lateral side of the above described multilayer structure are electrically connected with each other. Similarly, the connector terminals 18 of the capacitor electrodes 17 on the first and second piezoelectric substrates 10a and 10b arranged at the other lateral side of the multilayer structure are electrically connected with each other. Then, the input/output connection terminal 13 of the first piezoelectric substrate 10a is connected to the input electrode 31 and the input/output connection terminal 13 of the second piezoelectric substrate 10b is connected to the output electrode 32, whereas the electrode patterns P2 on the second surfaces of the first and second piezoelectric substrates 10a and 10b are electrically connected to the grounding electrode 33.

Now, the conductors for connecting the electrodes will be discussed below.

The spacers 20a, 20b and 20c are provided respectively with recesses 22a, 22b, 22c at relevant edges thereof. After the components are assembled to form a multilayer structure, the electrodes are electrically connected by filling the recesses 22a, 22b and 22c with an electrically conductive material 40 (see FIG. 4). In other words, the electrically conductive material 40 filled in the recesses 22a, 22b and 22c forms conduction paths for connecting the electrodes.

As described above, one of the piezoelectric substrates 10a and 10b is longitudinally turned upside down so that the electrode patterns P1 and P2 appear symmetric if viewed from above and the connector edges 15 of the capacitor electrodes 14 and the connector terminals 18 of the capacitor electrodes 17 are vertically aligned respectively.

Figure 7:
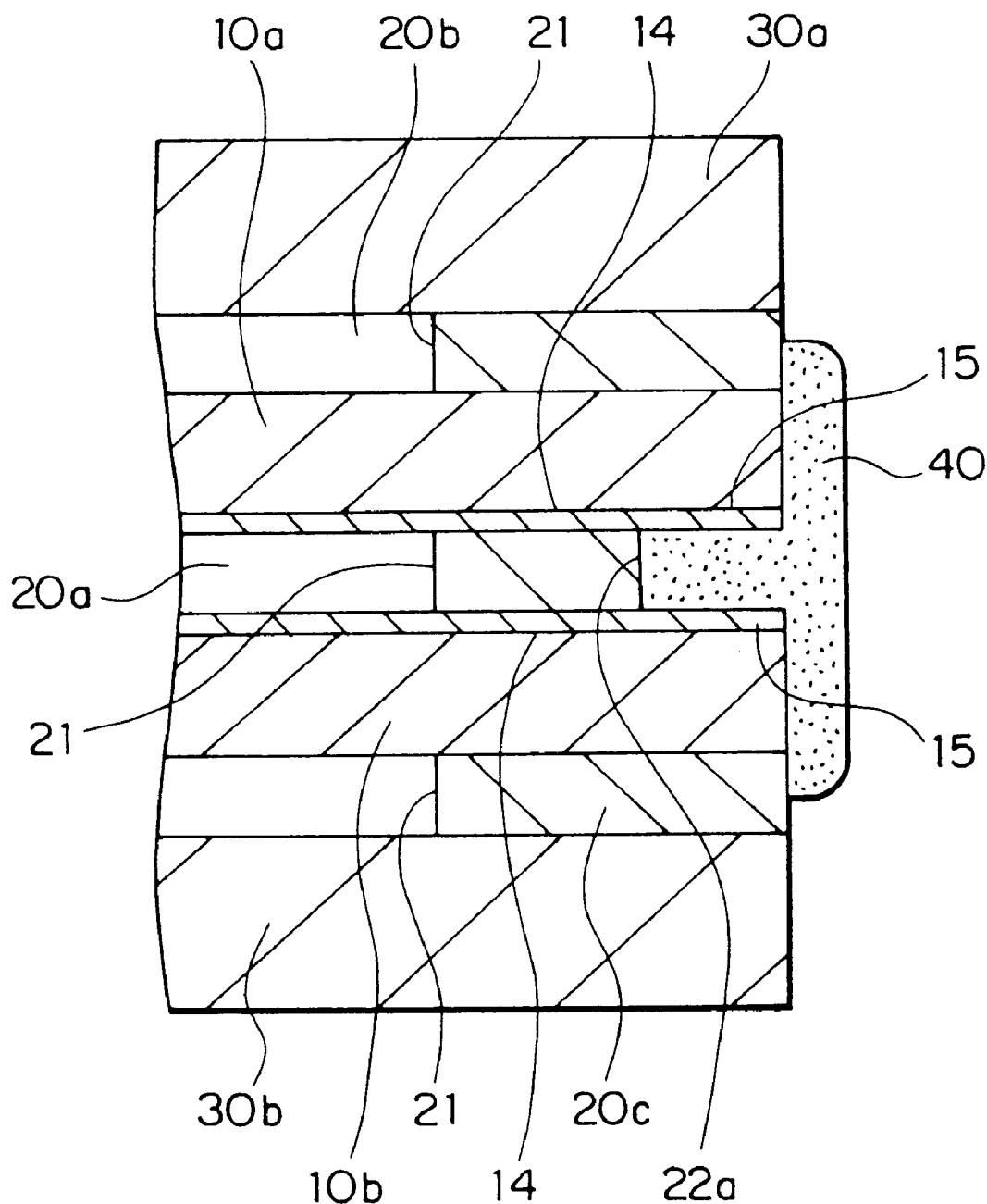
FIG. 7 is an enlarged schematic longitudinal cross sectional view of the embodiment of FIG. 4, showing the some of the electric conductors of an electrically conductive material.

As shown in FIGS. 5 and 7, the connector edges 15 of the capacitor electrodes 14 are connected with each other by means of the electrically conductive material 40 filled in the recesses 22a along the right edge (in FIG. 5) of the spacer 20a. Similarly, the connector terminals 18 of the capacitor electrodes 17 are connected with each other and also to the grounding electrode 33 by means of the electrically conductive material 40 filled in the recesses 22b and 22c at the middle of the right edges (in FIG. 5) of the spacers 20b and 20c. Finally, the input/output connection terminal 13 of the piezoelectric substrate 10a is connected to the input electrode 31 by way of the electrically conductive material 40 filled in the recess 22a at the rear left corner (not visible in FIG. 5) of the spacer 20a, whereas the input/output connection terminal 13 of the piezoelectric substrate 10b is connected to the output electrode 32 by way of the electrically conductive material 40 filled in the recess 22a at the front left corner (in FIG. 5) of the spacer 20a. The input electrode 31 is then electrically connected to an input side external conduction path, whereas the output electrode 32 is electrically connected to an output side external conduction path.

The piezoelectric filter F1 of this embodiment having the above described configuration shows a substantially square profile whose upper and lower surfaces have an area that is about a half of the surface area of any conventional piezoelectric filter of the type under consideration. Additionally, the upper and lower insulating cover plates 30a and 30b protect the electrode patterns P1 and P2 both mechanically and electrically while the electrically conductive material 40 and the electrodes 31, 32 and 33 are exposed only on the peripheral surfaces and the lower surface to make the piezoelectric filter F1 easy to handle.

Figure 1:
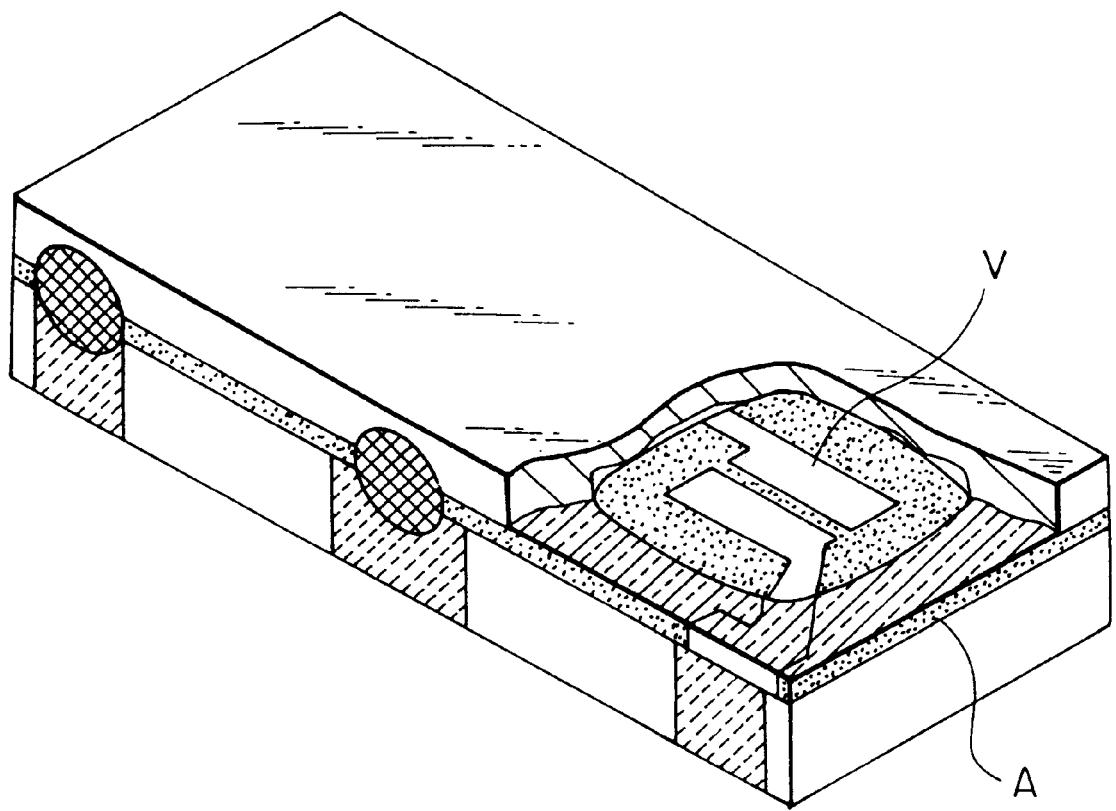
FIG. 1 is a partly cut-away schematic perspective view of a conventional known piezoelectric filter.
Figure 2A:
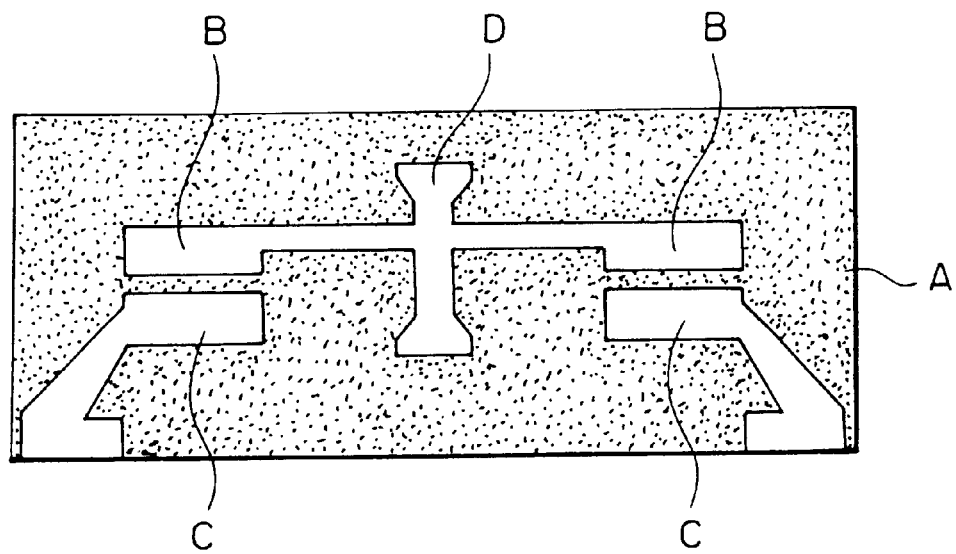
FIG. 2A is a schematic plan view of the upper surface of the conventional piezoelectric filter of FIG. 1.
Figure 2B:
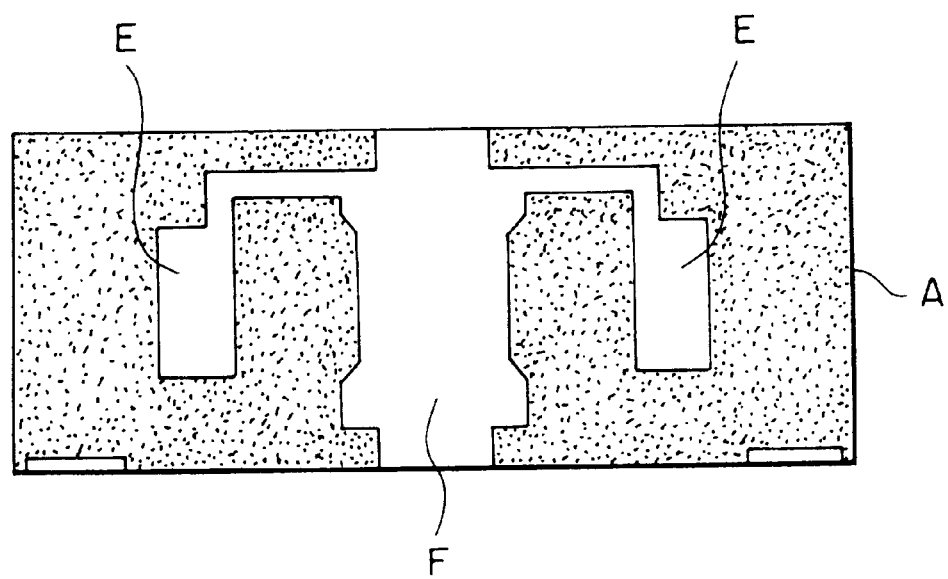
FIG. 2B is a schematic plan view of the lower surface of the conventional piezoelectric filter of FIG. 1.
Figure 3:
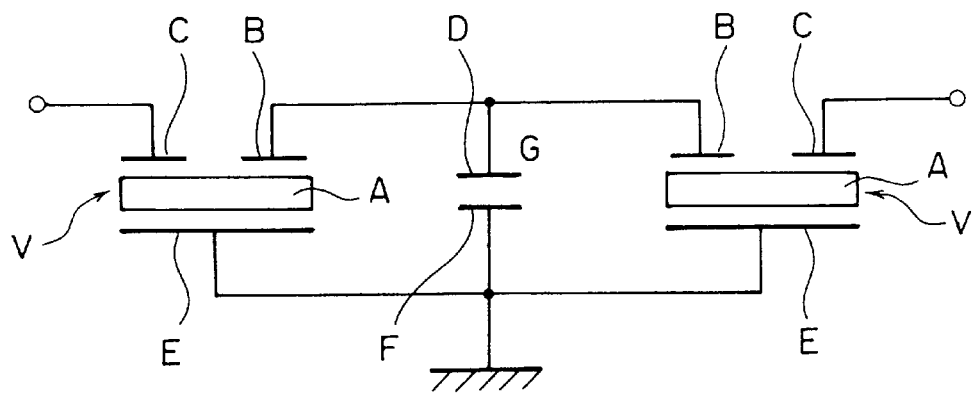
FIG. 3 is a schematic circuit diagram of an equivalent circuit of the conventional piezoelectric filter of FIG. 1.

FIG. 9 shows a circuit diagram of an equivalent circuit of the piezoelectric filter F1 when the conductors are arranged on it. Unlike the conventional circuit of FIG. 3, this circuit comprises a pair of coupling capacitors C1 and C2 connected in parallel, the total coupling capacitance of the circuit being the sum of the capacitances of the two capacitors. Thus, a desired and sufficient coupling capacitance can be secured for the circuit that has the above described circuit configuration. It will be appreciated that such a circuit can be designed without difficulty.

A piezoelectric filter F1 having the above described circuit configuration is adapted to mass production.

Figure 8:
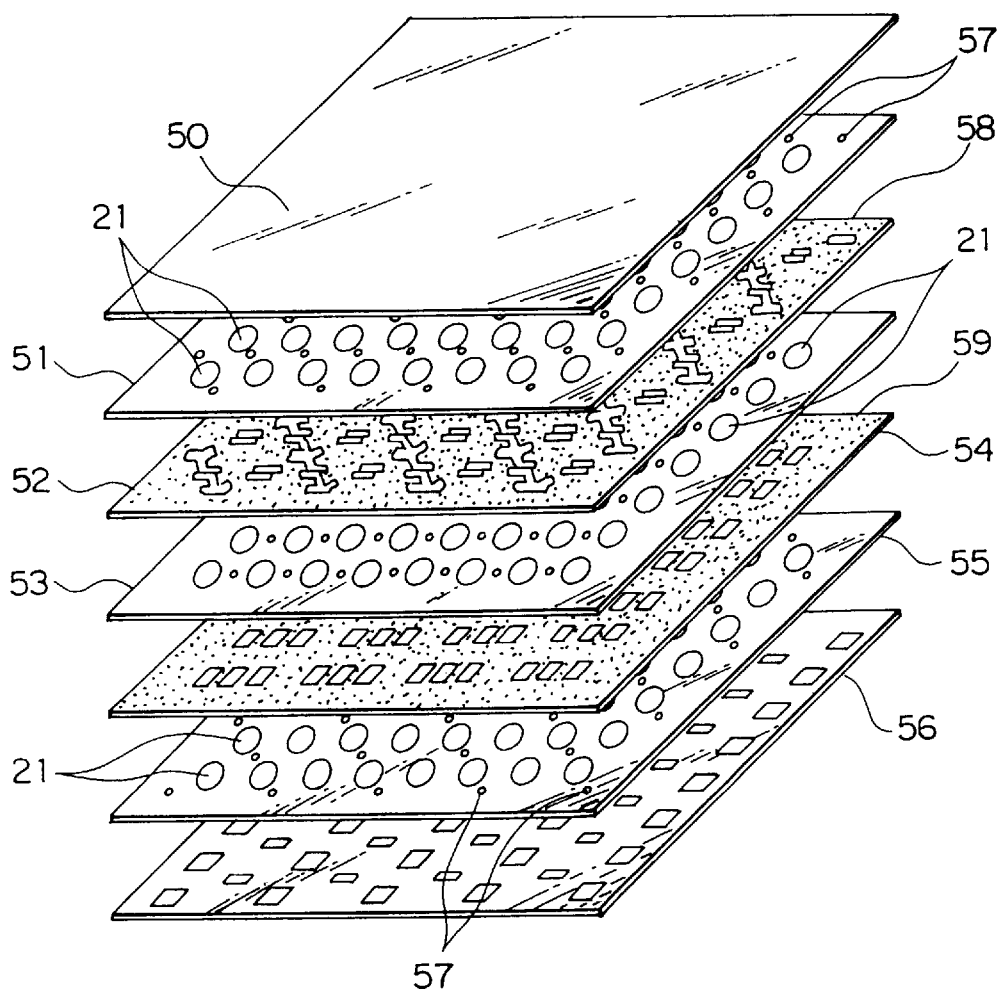
FIG. 8 is an exploded schematic perspective view of sheets to be used for manufacturing piezoelectric filters according to the invention on a mass production basis.

More specifically, as shown in FIG. 8, such filters can be produced by laying sheets 50, 51, 52, 53, 54, 55 and 56, cutting the multilayer structure into units and then filling the recesses 22a through 22c of each unit with an electrically conductive material 40.

Of the sheets 50 through 56, the sheet 51 is used for spacers 20b and provided with circular openings 21. Small holes 57, each of which is arranged between two adjacent openings 21, are arranged for recesses 22b, which are produced when the sheet 51 is cut along the rows and the columns of the small holes 57. Similarly, the sheets 53 and 55 are also provided with circular openings 21 and small holes 57. Recesses 22a and 22c are produced when the sheets 53 and 55 are cut along the rows and the columns of the small holes 57. The sheets 52 and 54 are made of a piezoelectric ceramic material such as PZT and carry on the opposite sides of thereof electrode patterns 58 and 59 formed by deposition of silver that are reduced to electrode patterns P1 and P2 when the sheets are cut into units.

Figure 10:
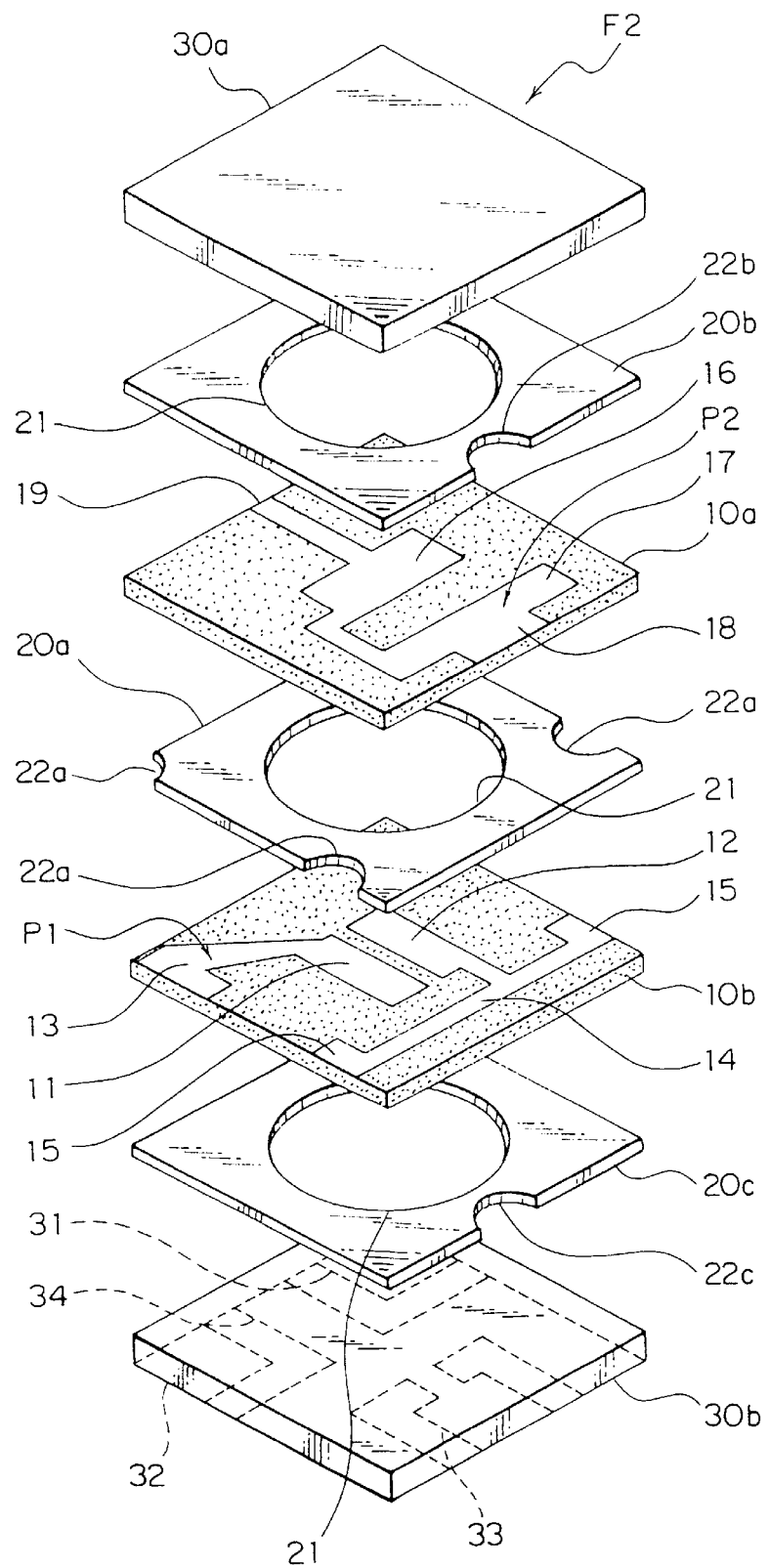
FIG. 10 is an exploded schematic perspective view of a second embodiment of energy trapping type piezoelectric filter F2 according to the present invention.

Now, a second embodiment of the invention will be described by referring to FIG. 10. The components of this embodiment same or similar to those of the first embodiment shown in FIGS. 4 through 6 are denoted respectively by the same reference symbols.

Figure 11A:
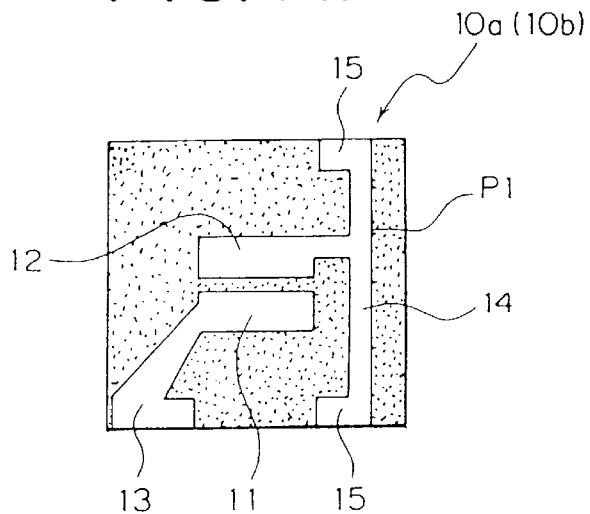
FIG. 11A is schematic plan views showing the upper surface of each of the piezoelectric substrates in an embodiment in which shield electrodes are arranged only on the piezoelectric substrates.
Figure 11B:
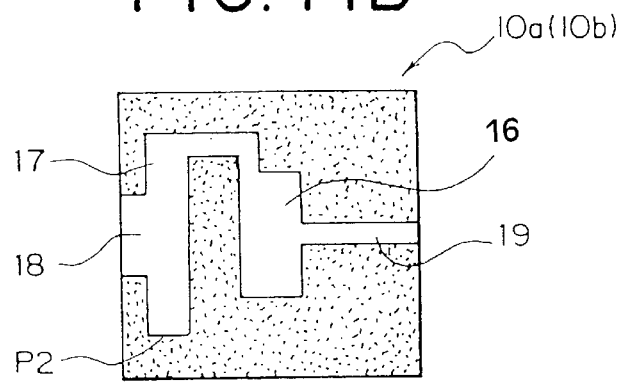
FIG. 11B is schematic plan views showing the lower surface of the piezoelectric substrate in the embodiment of FIG. 11A.
Figure 15A:
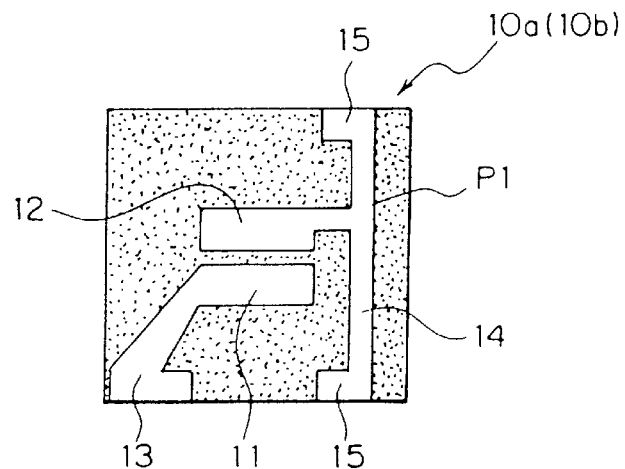
FIG. 15A is a schematic plan view showing the upper surface of each of the piezoelectric substrates in an embodiment, having shield electrodes arranged on the piezoelectric substrates and another shield electrode arranged on the lower insulating cover plate.
Figure 15B:
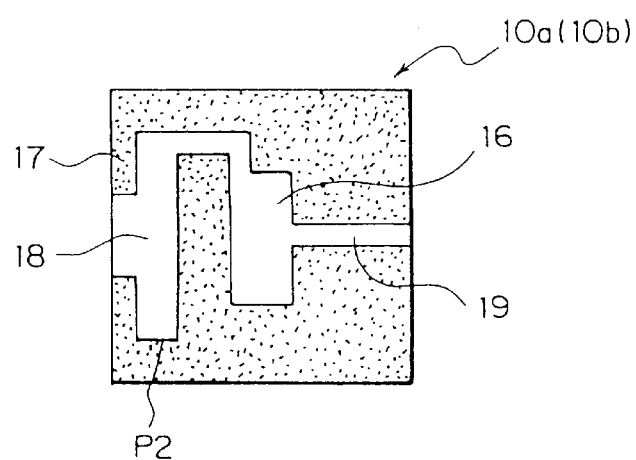
FIG. 15B is a schematic plan view showing the lower surface of the piezoelectric substrate OF FIG. 15A.

In the second embodiment, as will be seen in FIGS. 11B and 15B the electrode patterns P2 on the second surfaces of the first piezoelectric substrate 10a and the second piezoelectric substrate 10b include respective linear shield electrodes 19 to be disposed, if viewed from above, between the input/output connection terminal 13 of the first piezoelectric substrate 10a and the input/output connection terminal 13 of the second piezoelectric substrate 10b that are located askance relative to each other on a same side of the piezoelectric filter F2. In other words, the shield electrodes 19 are located between the input/output connection terminal 13 of the first piezoelectric substrate 10a and the input/output connection terminal 13 of the second piezoelectric substrate 10b in the laminate of the piezoelectric filter F2. The shield electrodes 19 are grounded by way of the grounding electrode 33 connected to the electrode patterns on the second surfaces of the piezoelectric substrates 10a and 10b. Therefore, the input/output connection terminals 13 of the first and second piezoelectric substrates 10a and 10b are prevented from being electromagnetically coupled with each other due to the grounded shield electrodes 19.

Additionally, because the input electrode 31 and the output electrode 32 are arranged respectively vis-a-vis the input/output connection terminals 13 as viewed from a lateral side, the shield electrodes 19 are also found between the input electrode 31 and the output electrode 32 to prevent any electromagnetic coupling of the input electrode 31 and the output electrode 32.

Figure 13A:
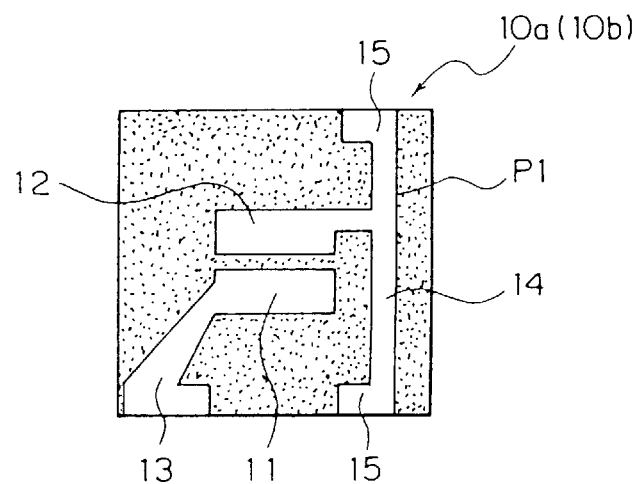
FIG. 13A is a schematic plan view showing the upper surface of each of the piezoelectric substrates in an embodiment in which a shield electrode is arranged on a lower insulating cover plate.
Figure 13B:
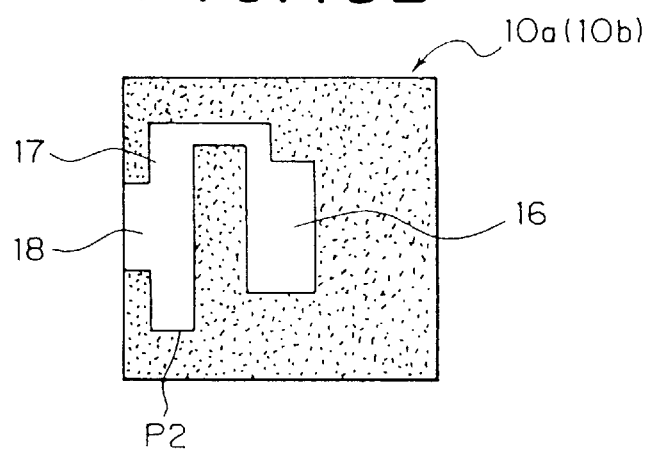
FIG. 13B is a schematic plan view showing the lower surface of the piezoelectric substrate of FIG. 13A.
Figure 13C:
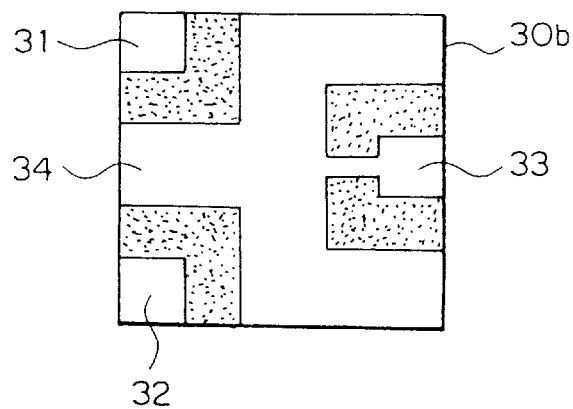
FIG. 13C is a schematic plan view showing the lower surface of the lower insulating cover plate in the embodiment in which a shield electrode is arranged on the lower insulating cover plate.
Figure 15C:
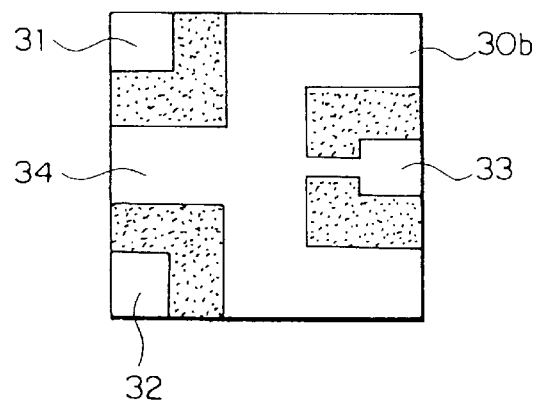
FIG. 15C is a schematic plan view showing the lower surface of the lower insulating cover plate in the embodiment having shield electrodes arranged on the piezoelectric substrates and another shield electrode arranged on the lower insulating cover plate.

Still additionally, as illustrated in in FIGS. 13C and 15C, another shield electrode 34 extending from the grounding electrode 33 is provided on the lower surface of the insulating cover plate 30b to isolate the input electrode 31 and the output electrode 32.

As a result, the input electrode 31 and the output electrode 32 are prevented from being electromagnetically coupled with each other by the shield electrode 34 that is integral with the grounding electrode 33. Furthermore, since the input/output connection terminals 13 are located respectively vis-a-vis the input electrode 31 and the output electrode 32 as viewed from a lateral side, the shield electrode 34 also prevent the input/output connection terminals 13 from being electromagnetically coupled with each other.

While a piezoelectric filter F1 according to the invention may be provided only with a pair of shield electrodes 19 arranged in the respective electrode patterns P2 or a shield electrode 34 extending from the grounding electrode 33 in order to prevent any electromagnetic coupling from occurring, the preventive effect is enhanced when all of them are used.

Figure 11C:
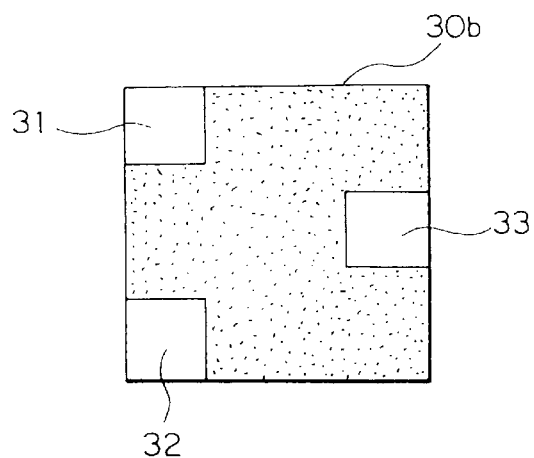
FIG. 11C is schematic plan views showing the lower surface of a lower insulating cover plate in a embodiment in which shield electrodes are arranged only on the piezoelectric substrates.
Figure 12:
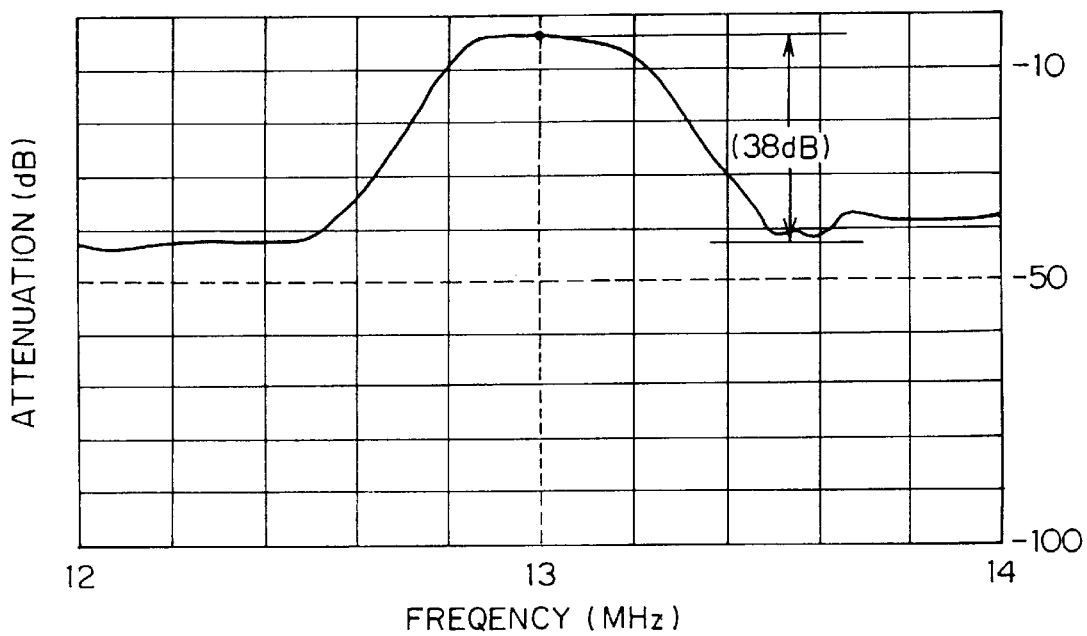
FIG. 12 is a graph showing the attenuation characteristic of the embodiment of FIGS. 11A, 11B and 11C, having shield electrodes arranged only on the piezoelectric substrates.
Figure 14:
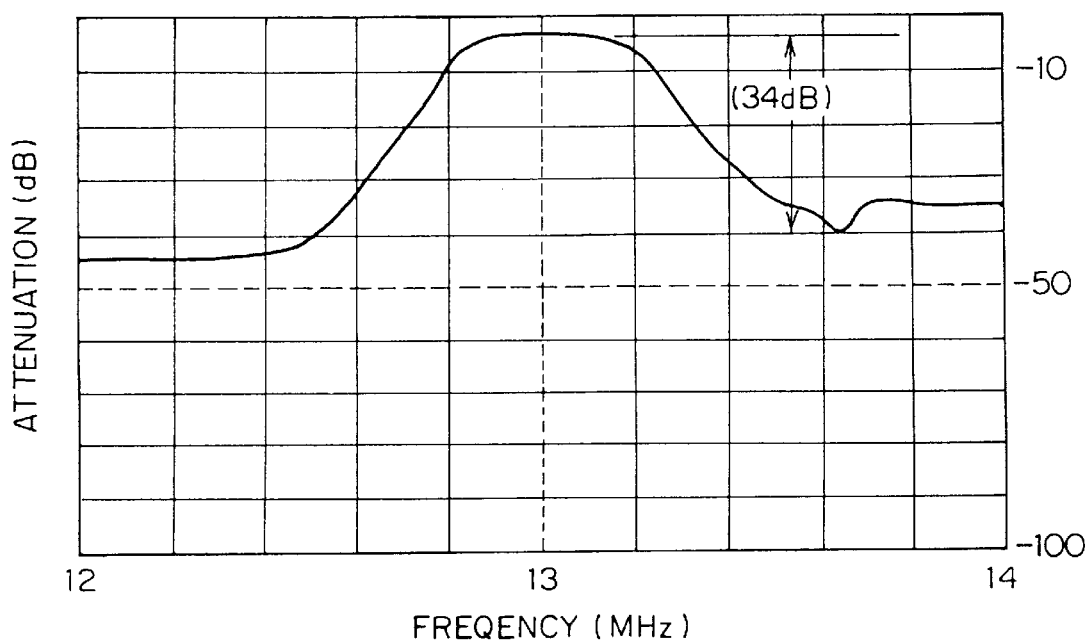
FIG. 14 is a graph showing an attenuation characteristic of the embodiment of FIGS. 13A, 13B and 13C.
Figure 16:
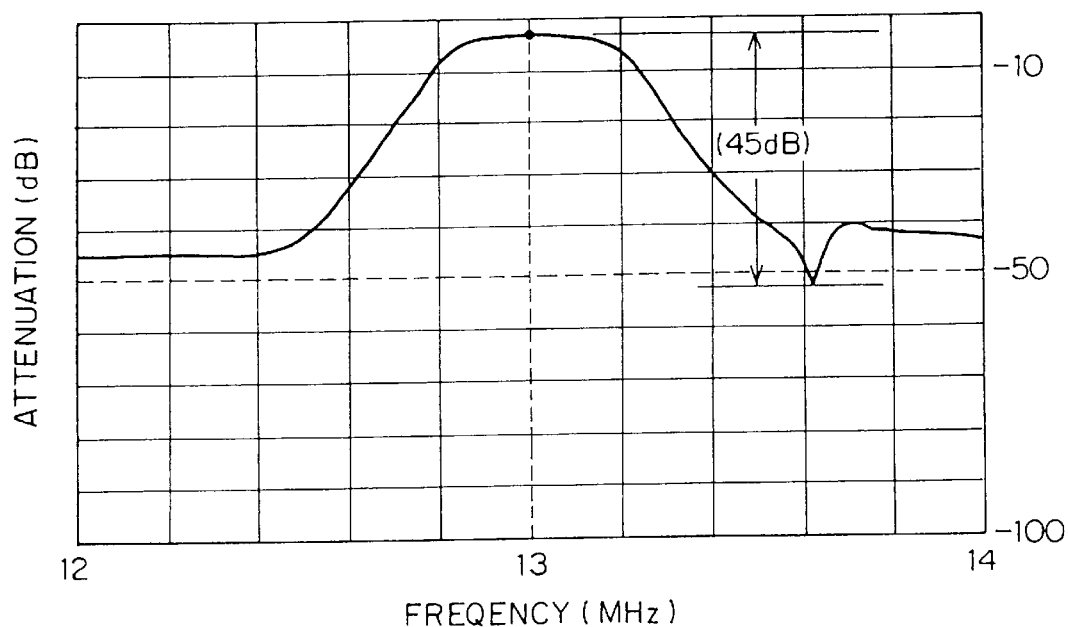
FIG. 16 is a graph showing an attenuation characteristic of the embodiment of FIG. 15.
Figure 17:
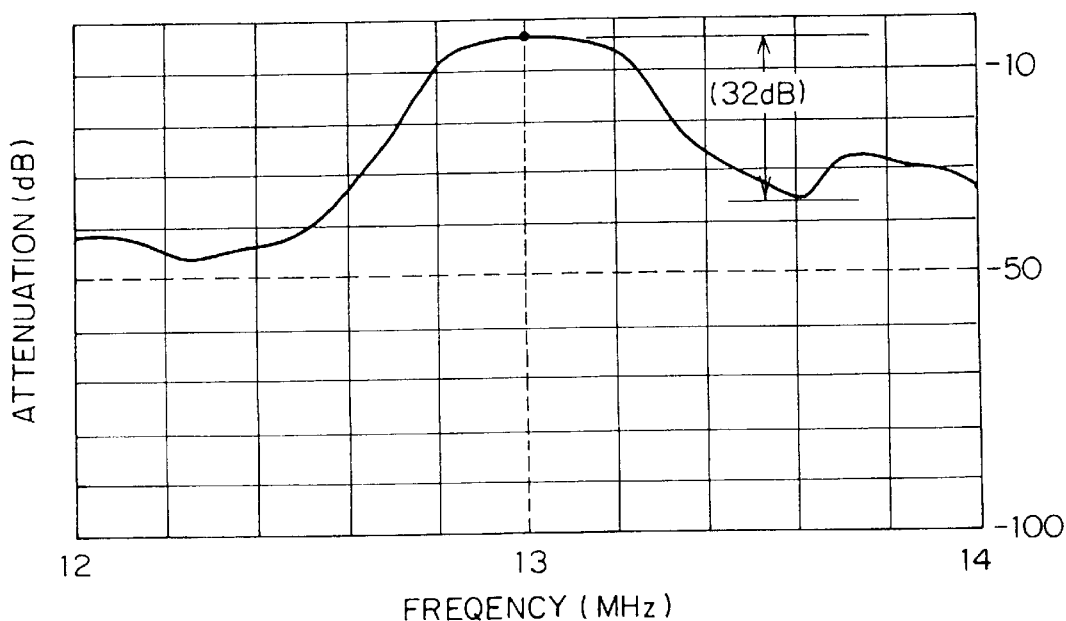
FIG. 17 is a graph showing an attenuation characteristic of a conventional piezoelectric filter.

FIGS. 11A,11B, 11C; 13A, 13B, 13C and 15A, 15B, 15C show three alternative arrangements of the shield electrodes 19 and 34 and FIGS. 12, 14, 16 show the attenuation effects of the respective arrangements. The attenuation of the above described conventional piezoelectric filter is 32dB as shown in FIG. 17.

In the case of FIGS. 11A,11B and 11C, only the electrode patterns P2 on the second surfaces of the piezoelectric substrates 10a and 10b include respective shield electrodes 19 to provide an attenuation effect as shown in FIG. 12. The attenuation of this arrangement is 38dB, showing a significant improvement from that of the above described conventional device.

Secondly, in the case of FIGS. 13A, 13B and 13C, only the insulating cover plate 30b is equipped with a shield electrode 34 as extension of the grounding electrode 33 to provide an attenuation effect as shown in FIG. 14. The attenuation of this arrangement is 34dB, also showing a significant improvement from that of the above described conventional device.

Finally, in the case of FIGS. 15A, 15B and 15C, the electrode patterns P2 on the second surfaces of the piezoeloelectric substrates 10a and 10b include respective shield electrodes 19 and the insulating cover plate 30b is equipped with a shield electrode 34 which is the extension of the grounding electrode 33 to provide an attenuation effect as shown in FIG. 16. The attenuation of this arrangement is 45 dB to prove a remarkable improvement from that of the above described conventional device.

As seen from above, a significant improvement can be achieved in the attenuation effect of a piezoelectric filter F2 according to the invention by providing it either with shield electrodes 19 or with a shield electrode 34. The improvement in the attenuation effect will become remarkable when the piezoelectric filter is provided with shield electrodes 19 and also with a shield electrode 34. In other words, by providing shield electrodes 19 and 34, a piezoelectric filter F2 can show a desired attenuation characteristic while the surface area of the piezoelectric filter is reduced to a half of that of a comparable conventional device.

As described above in detail, the energy trapping type piezoelectric filter F1 according to the first embodiment of the present invention comprises first and second identical piezoelectric substrates 10a and 10b, each carrying on a first surface thereof a pair of oscillation electrodes 11 and 12 arranged vis-a-vis relative to each other and a capacitor electrode 14, one of said oscillation electrodes, or oscillation electrode 12 being electrically connected to said capacitor electrode 14, the other oscillation electrode 11 being electrically connected to an input/output connection terminal 13 also arranged on the first surface to form an electrode pattern P1 on the first surface, and on the other surface, or the second surface thereof, a common electrode 16 arranged oppositely relative to said pair of oscillation electrodes 11 and 12 and a capacitor electrode 17 arranged opposite to said capacitor electrode as viewed from a lateral side, said capacitor electrode 17 and said common electrode 16 being electrically connected to each other to form an electrode pattern P2 on the second surface, said pair of oscillation electrodes 11 and 12 and said common electrode 16 forming an oscillating section V, said pair of capacitor electrodes 14, 17 forming a coupling capacitor C1 (C2), said first and second piezoelectric substrates 10a and 10b being laid on the other.

Thus, the first and second piezoelectric substrate 10a and 10b, each having a single oscillating section V are laid one on the other to reduce the surface area of the piezoelectric filter F1 to about a half of that of any conventional piezoelectric filters.

Additionally, the piezoelectric substrates 10a and 10b respectively carry thereon coupling capacitors C1, C2, which coupling capacitors are connected in parallel so that the coupling capacitance of the device can be selected freely to allow an enhanced degree of freedom for the design of the device if compared with known piezoelectric filters of the type under consideration having a single coupling capacitor.

Furthermore, with the piezoelectric filter F2 according to the second embodiment of the present invention comprising a pair of piezoelectric substrates 10a and 10b which carry thereon electrode patterns P1 and P2, are laid one on the other and are sandwiched by a pair of outermost insulating cover plates 30a and 30b, the electrode patterns P2 on the second surfaces of the piezoelectric substrates 10a and 10b include respective shield electrodes 19 and/or the lower insulating cover plate 30b has a shield electrode 34 extended from the grounding electrode 33.

With this arrangement, any tendency of electromagnetically coupling the input electrode 31 and the output electrode 32 and the two input/output connection terminals 13 are obstructed to improve the attenuation characteristic of the piezoelectric filter. Thus, the energy trapping type piezoelectric filter according to the present invention can reduce the surface area by laying a pair of piezoelectric substrates 10a and 10b one on the other without sacrificing the performance of the device. Furthermore, the energy trapping type piezoelectric filter according to the present invention operates better than any comparable conventional devices.

What is claimed is:

1. An energy trapping type piezoelectric filter comprising first and second identical piezoelectric substrates being laid one on the other to form a multilayer structure;

a first electrode pattern provided on a first surface of each of the first and second piezoelectric substrates, the first electrode pattern including first and second oscillation electrodes arranged vis-a-vis relative to each other and a first capacitor electrode, one of said oscillation electrodes being electrically connected to said first capacitor electrode, the other oscillation electrode being electrically connected to an input/output connection terminal which is provided on the first surface;

a second electrode pattern provided on a second surface of each of the first and second piezoelectric substrates, the second electrode pattern including a common electrode arranged oppositely relative to said pair of oscillation electrodes and a second capacitor electrode arranged opposite to said first capacitor electrode, said second capacitor electrode and said common electrode being electrically connected to each other;

a pair of oscillating sections, each oscillating section including a pair of the first and second oscillation electrodes and said common electrode on each of the first and second piezoelectric substrates;

a pair of coupling capacitors, each coupling capacitor including said first and second capacitor electrodes on each piezoelectric substrate;

spacer members arranged to be disposed on the respective surfaces of said first and second piezoelectric substrates and each having an opening for not obstructing the oscillation of each of the oscillating sections, said first and second piezoelectric substrates being sandwiched by the spacer members;

a pair of insulating cover plates provided on a top and bottom surfaces of said multilayer structure; and conductor means for electrically connecting the first capacitor electrodes on the respective first surfaces of said first and second piezoelectric substrates relative to each other, the second capacitor electrodes on the respective second surfaces of said first and second piezoelectric substrates relative to each other, the input/output connection terminals respectively to an input electrode and an output electrode arranged at a side of the filter and exposed to the outside and the second electrode pattern on the second surfaces to a grounding electrode arranged at another side of the filter and exposed to the outside.

2. An energy trapping type piezoelectric filter as claimed in claim 1, wherein the input/output connection terminals connected to the second oscillation electrode are displaced from the center of a related lateral edge and the paired capacitor electrodes are vertically aligned when the first and second piezoelectric substrates are oppositely turned upside down and superimposed.

3. An energy trapping type piezoelectric filter as claimed in claim 1, wherein the spacer members are provided with recesses along the edges thereof that are filled with an electrically conductive material to produce conduction paths for connecting the input/output connection terminals respectively to the input electrodes and the output electrodes and the second electrode patterns on the second surfaces to the grounding electrode.

4. An energy trapping type piezoelectric filter as claimed in claim 1, wherein the other of the first and second oscillation electrodes on each of the first and second piezoelectric substrates is extended obliquely to a corner of each of the first and second piezoelectric substrates, and each of said the input/output connection terminals is formed by the extension portion of said one oscillation electrode.

5. An energy trapping type piezoelectric filter as claimed in claim 1, wherein said second capacitor electrode on each of the first and second piezoelectric substrates extends laterally to a corresponding lateral edge to form a grounding connecter terminal.

6. An energy trapping type piezoelectric filter as claimed in claim 1, wherein said pair of coupling capacitors are connected in parallel.

7. An energy trapping type piezoelectric filter comprising a first and second identical piezoelectric substrates, each of which has a first surface provided with a pair of oscillation electrodes arranged vis-a-vis relative to each other and a first capacitor electrode, and a second surface provided with a common electrode arranged oppositely relative to said pair of oscillation electrodes and a second capacitor electrode arranged opposite to said first capacitor electrode;

one of said oscillation electrodes being electrically connected to said first capacitor electrode, the other oscillation electrode being electrically connected to an input/output connection terminal which is arranged on the first surface;

said second capacitor electrode and said common electrode being electrically connected to each other;

said pair of oscillation electrodes and said common electrode forming an oscillating section, said pair of first and second capacitor electrodes forming a coupling capacitor, said first and second piezoelectric substrates being laid one on the other to form a multilayer structure without obstructing the oscillation of the oscillating sections, turning said first piezoelectric substrate or said second piezoelectric substrates upside down to make said pair of capacitor electrodes vertically aligned relative to each other and said input/output connection terminals separated from each other along a same edge of the multilayer structure of the piezoelectric filter;

the first capacitor electrodes on the first surfaces and the second capacitor electrodes on the second surfaces of said first and second piezoelectric substrates being electrically connected with each other, a pair of insulating cover plates for sandwiching said pair of piezoelectric substrates, one of said insulating cover plates having an input electrode vertically aligned with and electrically connected to the input/output connection terminal of the first piezoelectric substrate, an output electrode vertically aligned with and electrically connected to the input/output connection terminal of the second piezoelectric substrate and a grounding-electrode electrically connected to the electrodes on the second surfaces of the pair of piezoelectric substrates; and shield electrode members each being provided on the second surface of each of the pair of piezoelectric substrates and extending from said common electrode to an outer edge portion of the second surface for obstructing any electromagnetic coupling of said pair of input/output connection terminals.

8. An energy trapping type piezoelectric filter comprising a first and second identical piezoelectric substrates, each of which has a first surface provided with a pair of oscillation electrodes arranged vis-a-vis relative to each other and a first capacitor electrode, and a second surface provided with a common electrode arranged oppositely relative to said pair of oscillation electrodes and a second capacitor electrode arranged opposite to said first capacitor electrode;

one of said oscillation electrodes being electrically connected to said first capacitor electrode, the other oscillation electrode being electrically connected to an input/output connection terminal which is arranged on the first surface;

said second capacitor electrode and said common electrode being electrically connected to each other;

said pair of oscillation electrodes and said common electrode forming an oscillating section, said pair of first and second capacitor electrodes forming a coupling capacitor, said first and second piezoelectric substrates being laid one on the other to form a multilayer structure without obstructing the oscillation of the oscillating sections, turning said first piezoelectric substrate or said second piezoelectric substrate upside down to make said pair of capacitor electrodes vertically aligned relative to each other and said input/output connection terminals separated from each other along a same edge of the multilayer structure of the piezoelectric filter;

the first capacitor electrodes on the first surfaces and the second capacitor electrodes on the second surfaces of said first and second piezoelectric substrates; being electrically connected with each other, a pair of insulating cover plates for sandwiching said pair of piezoelectric substrates, one of said insulating cover plates having an input electrode vertically aligned with and electrically connected to the input/output connection terminal of the first piezoelectric substrate, an output electrode vertically aligned with and electrically connected to the input/output connection terminal of the second piezoelectric substrate and a grounding electrode electrically connected to the electrodes on the second surfaces of the pair of piezoelectric substrates; and a shield electrode member provided on said one insulating cover plate, extended between the input electrode and the output electrode and connected to the grounding electrode for obstructing said pair of input/output electrodes.

9. An energy trapping type piezoelectric filter comprising a first and second identical piezoelectric substrates, each of which has a first surface provided with a pair of oscillation electrodes arranged vis-a-vis relative to each other and a first capacitor electrode, and a second surface provided with a common electrode arranged oppositely relative to said pair of oscillation electrodes and a second capacitor electrode arranged opposite to said first capacitor electrode;

one of said oscillation electrodes being electrically connected to said first capacitor electrode, the other oscillation electrode being electrically connected to an input/output connection terminal which is arranged on the first surface;

said second capacitor electrode and said common electrode being electrically connected to each other;

said pair of oscillation electrodes and said common electrode forming an oscillating section, said pair of first and second capacitor electrodes forming a coupling capacitor, said first and second piezoelectric substrates being laid one on the other to form a multilayer structure without obstructing the oscillation of the oscillating sections, turning said first piezoelectric substrate or said second piezoelectric substrate upside down to make said pair of capacitor electrodes vertically aligned relative to each other and said input/output connection terminals separated from each other along a same edge of the multilayer structure of the piezoelectric filter;

the first capacitor electrodes on the first surfaces and the second capacitor electrodes on the second surfaces of said first and second piezoelectric substrates;

being electrically connected with each other, a pair of insulating cover plates for sandwiching said pair of piezoelectric substrates, one of said insulating cover plates having an input electrode vertically aligned with and electrically connected to the input/output connection terminal of the first piezoelectric substrate, an output electrode vertically aligned with and electrically connected to the input/output connection terminal of the second piezoelectric substrate and a grounding electrode electrically connected to the electrodes on the second surfaces of the pair of piezoelectric substrates;

first shield electrode members each being provided on the second surface of each of the pair of piezoelectric substrates and extending from said common electrode to an outer edge portion of the second surface for obstructing any electromagnetic coupling of said pair of input/output connection terminals; and second shield electrode member provided on said one insulating cover plate, extended between the input electrode and the output electrode and connected to the grounding electrode for obstructing any electromagnetic coupling of said pair of input/output electrodes.

* * * * *